(12) United States Patent
Lie

(10) Patent No.: US 7,010,772 B1
(45) Date of Patent: Mar. 7, 2006

(54) METHOD AND APPARATUS FOR GENERATING SUPERSET PINOUT FOR DEVICES WITH HIGH-SPEED TRANSCEIVER CHANNELS

(75) Inventor: James H. Lie, Santa Clara, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 372 days.

(21) Appl. No.: 09/940,749

(22) Filed: Aug. 28, 2001

(51) Int. Cl.
*G06F 17/50* (2006.01)
*G06F 7/38* (2006.01)

(52) U.S. Cl. ............................ 716/17; 326/39; 257/691
(58) Field of Classification Search ................. 716/17; 326/39; 257/691
See application file for complete search history.

(56) References Cited

U.S. PATENT DOCUMENTS

| | | | | |
|---|---|---|---|---|
| 5,128,871 | A * | 7/1992 | Schmitz ....................... | 716/17 |
| 6,120,550 | A * | 9/2000 | Southgate et al. ............. | 716/11 |
| 6,181,004 | B1 * | 1/2001 | Koontz et al. ............... | 257/691 |
| 6,320,410 | B1 * | 11/2001 | Malhotra et al. ............. | 326/39 |
| 6,650,142 | B1 * | 11/2003 | Agrawal et al. .............. | 326/41 |
| 6,671,868 | B1 * | 12/2003 | Lie .............................. | 716/16 |

OTHER PUBLICATIONS

M. Tervonen et al., Integrated Computer Aided Design, Documentation and Manufacturing System for PCB Electronics, 20th Design Automation Conference, pp. 436-443, Jun. 1983.*
Vinod Malhotra et al. , "Heterogeneous CPLD Logic Blocks", U.S. Appl. No. 09/525,955, filed Mar. 15, 2000, U.S. Patent 6,320,410.
InfiniBand™ Architecture Specification vol. 1, Release 1.0. a, Jun. 19, 2001, pp. 1-913.
InfiniBand™ Architecture Specification vol. 2, Release 1.0. a, Jun. 19, 2001, pp. 1-631.

* cited by examiner

Primary Examiner—A. M. Thompson
(74) Attorney, Agent, or Firm—Christopher P. Maiorana, PC

(57) ABSTRACT

A method for generating a superset pinout for a family of devices. First, a pinlist is defined for each device within the family of devices. Second, a superset listing of pins is generated from the pinlist. Third, the superset pinout for the family of devices is created from said superset listing of pins to eliminate potential footprint variations within the family of devices. Fourth, each pin of the superset pinout associated with each member of the family of devices is marked.

18 Claims, 4 Drawing Sheets

50

52

DEFINING A PINLIST FOR EACH DEVICE WITHIN A FAMILY OF DEVICES

54

GENERATING A SUPERSET LISTING OF PINS FROM THE PINLIST, NOTING WHICH PIN IS APPLICABLE TO WHICH DEVICE MEMBER

56

CREATING A SUPERSET PINOUT FOR THE DEVICE FAMILY

58

GENERATING A PINOUT SPECIFIC TO A PARTICULAR DEVICE MEMBER BY MARKING (OR CUSTOMIZING) THE SUPERSET GRID FOR EACH MEMBER USING THE INFORMATION ON WHICH PIN IS APPLICABLE TO WHICH DEVICE

METHOD AND APPARATUS FOR GENERATING SUPERSET PINOUT FOR DEVICES WITH HIGH-SPEED TRANSCEIVER CHANNELS

FIELD OF THE INVENTION

The present invention relates to a method and/or architecture for implementing interfaces generally, and more particularly, to a method and/or architecture for implementing a family of programmable logic and high-speed serial channel devices.

BACKGROUND OF THE INVENTION

Superset pinouts are used on packages that house different densities of complex programmable logic devices (CPLD). Transceiver devices (or the like) with varying number of channels have unique pinouts to accommodate the varying I/O requirements. However, increasing the number of pins increases power consumption. Larger numbers of channels also need additional die space. Furthermore, programmable logic devices (PLDs) and transceiver devices are typically mounted in separate packages to accommodate unique I/O packaging requirements for each device.

Devices with combined programmable logic and high-speed serial channels are increasingly appearing in the marketplace. However, defining unique pinouts for parts with different programmable density or different high-speed serial transmission bandwidth within a family of parts makes applicability difficult for users (i.e., migration between higher and lower density parts). For example, when a user desires to switch to a transceiver with a larger number of high-speed serial channels, the board layout for the transceiver chip needs to be changed. Such a change can include the footprint of the transceiver device, routing of the transceiver chip, and/or other affected routing on the board. Additionally, complex routing and timing issues between the devices will have to be resolved.

SUMMARY OF THE INVENTION

The present invention concerns a method for generating superset pinouts for a family of devices, comprising the steps of (A) defining a pinlist for each device within the family of devices, (B) generating a superset listing of pins from the pinlist, (C) creating the superset pinout for the family of devices, and (D) marking each pin of the superset pinout associated with each member of the family of devices.

The objects, features and advantages of the present invention include providing a method and/or architecture for implementing programmable logic and high-speed serial channel devices that may have different gate densities and/or different numbers and functions of transceiver channels that may all be accommodated by a superset pinout that may (i) allow migration paths to higher CPLD gate densities, (ii) increase serializer/deserializer (SERDES) transceiver bandwidth, (iii) reduce or eliminate footprint change when users replace a device with another having a different programmable logic gate density, (iv) provide a common footprint, (v) reduce or eliminate layout change when users replace a device with another having a different number of high-speed serial channels, (vi) reduce production costs thereby providing a savings to the manufacture and/or (vii) reduce or eliminate layout change when users replace a device with another having different high-speed transceiver function.

BRIEF DESCRIPTION OF THE DRAWINGS

These and other objects, features and advantages of the present invention will be apparent from the following detailed description and the appended claims and drawings in which:

FIG. 2 is a detailed block diagram of an exemplary implementation of the present invention; and FIG. 3 is a detailed block diagram of an exemplary implementation of the present invention.

DETAILED DESCRIPTION OF THE PREFERRED EMBODIMENTS

Figure 1B:
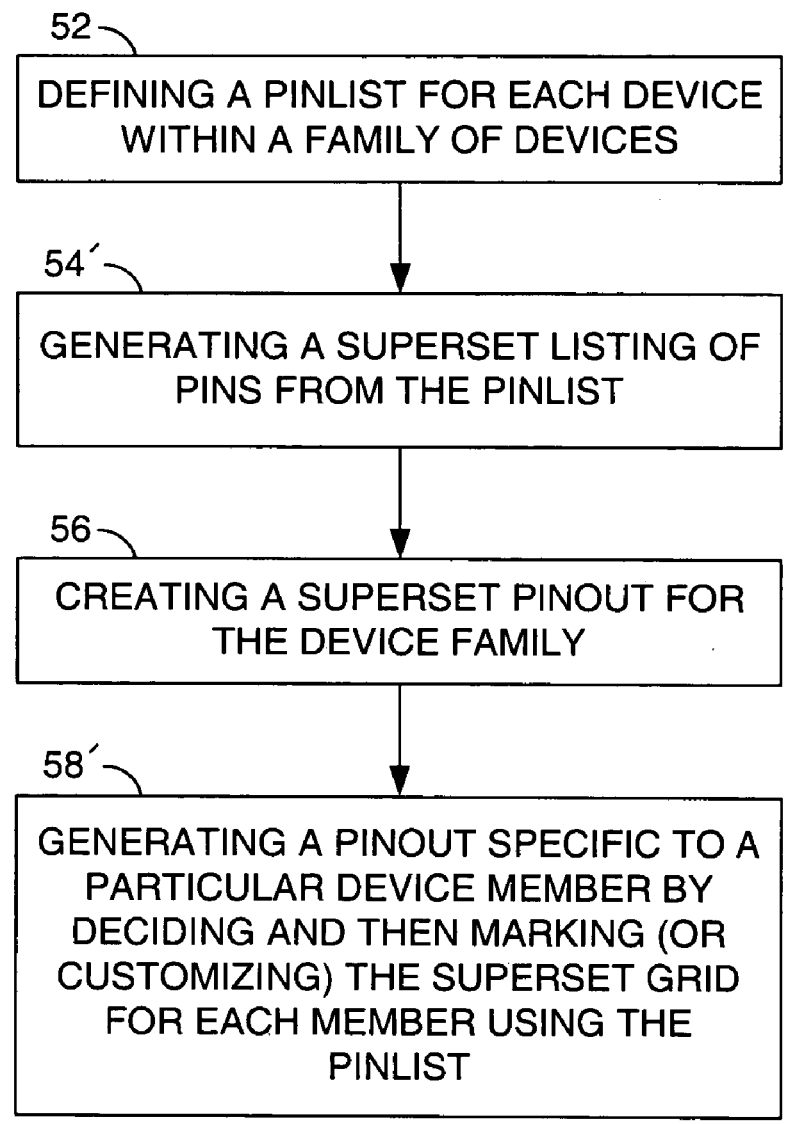
FIGS. 1(*a*–*b*) are flow charts illustrating preferred embodiments of the present invention.

Referring to FIGS. 1*a* and 1*b*, processes (or methods) 50 and 50' are shown in accordance with preferred embodiments of the present invention. The process 50 (or 50') may provide (or generate) a superset pinout for a family of devices. Such a family may be configured to provide various programmable logic and high-speed transceiver channel configurations. In particular, the present invention may be directed to programmable serial interfaces (PSI). (PSI™ is a trademark of Cypress Semiconductor Corporation, San Jose, Calif., referring to devices with combined programmable logic and high-speed serial channels) PSI may be a family of devices with varying amounts of programmable logic gate density and varying numbers and functions of transceiver channels (e.g., high-speed serial channels) across members.

The superset pinout of the present invention may allow customers to migrate from one member of the family with a particular programmable logic gate density and a particular number or function of high-speed serial channels to another member in the family. Such a configuration may allow other members of the family to have a different programmable logic gate density, a different number of high-speed serial channels, and/or a different function of the serial channels, or all of the above. The process 50 (or 50') may allow migration from one member to another member to not involve changes in footprint or layout.

Pinout may refer to a layout of the signals for a device (e.g., a list of physical pins of a device package and functions assigned to those pins). For example, a pinout may be a list of pins and pin functions for quad flat pack (QFP) (e.g., pin1=ground, pin2=signal A, etc.) and for a ball grid array (BGA) (e.g., A1=Ground, A2=signal A, etc.) Pinlist may refer to a list of signals for a device to be assigned to physical pins to become the functions of the pins (e.g., the ground, signal A, etc.). For simplicity a BGA ball may also be referred to as a pin.

The present invention may be directed to a method for generating superset pinout for devices with combined programmable logic with high-speed serial channels. The method 50 (or 50') may provide common footprints and layouts for a family of devices. The process 50 of FIG. 1*a* may comprise a state 52, a state 54, a state 56, and a state 58. The superset pinout method 50 may be as follows:

While in the state 52, the process 50 may define the pinlist for each device within a family of devices. The process 50 may define what pins and how many of each are required for each device (as if generating a unique pinout for that device). For example, if there are two members in the family for which to create a superset pinout, then the individual pinlist may be:

MEMBERA: AABC (two pins of A)
MEMBERB: ABD

While in the state 54, the process 50 may generate a superset listing of pins from the individual pinlist (e.g., combining pins that can be shared by more than one member). The process 50 may note which pins are applicable to which device members. Therefore, from the two members MEMBERA and MEMBERB, the superset pinlist may be AABCD.

While in the state 56, the process 50 may create a pinout for a chosen package (e.g. QFP, BGA, etc.) for each signal in the superset pinlist. The method 50 may allocate a pin in the pinout. Other factors that generally come into play in creating a pinout may also be considered (e.g., certain signals may have to be adjacent in the pinout, etc.). However, each physical pin may have a single function. For example, a pin associated with function C may not have function D too, even though the signals C and D may apply to different members.

While in the state 58, the process 50 may mark pins associated with each member after the pinout is completed. The process 50 may generate a pinout specific to a particular device member by marking (or customizing) a superset grid (illustrated in FIGS. 2 and 3) for each member using information generated at the state 54 (e.g., information regarding which pin is applicable to which device). For example, a single A may be applicable to both members MEMBERA and MEMBERB, while C may be applicable to member MEMBERA. Pins not applicable to a particular member device may be marked "no-connect" (or NC) for the device. Users may then optionally ignore the no-connect pins if using one specific member of the family. Therefore, the process 50 may provide a footprint that may be common to all members in the family and a superset pinout that accommodates the needs of all members.

The method 50' of FIG. 1b may be similar to the method 50 of FIG. 1a. However, while in the state 54', the process 50' may generate a superset listing of pins from the pinlist. While in the state 58' the process 50' may generate a pinout specific to a particular device member by deciding and then marking (or customizing) the superset grid for each member using the pinlist.

Figure 2:
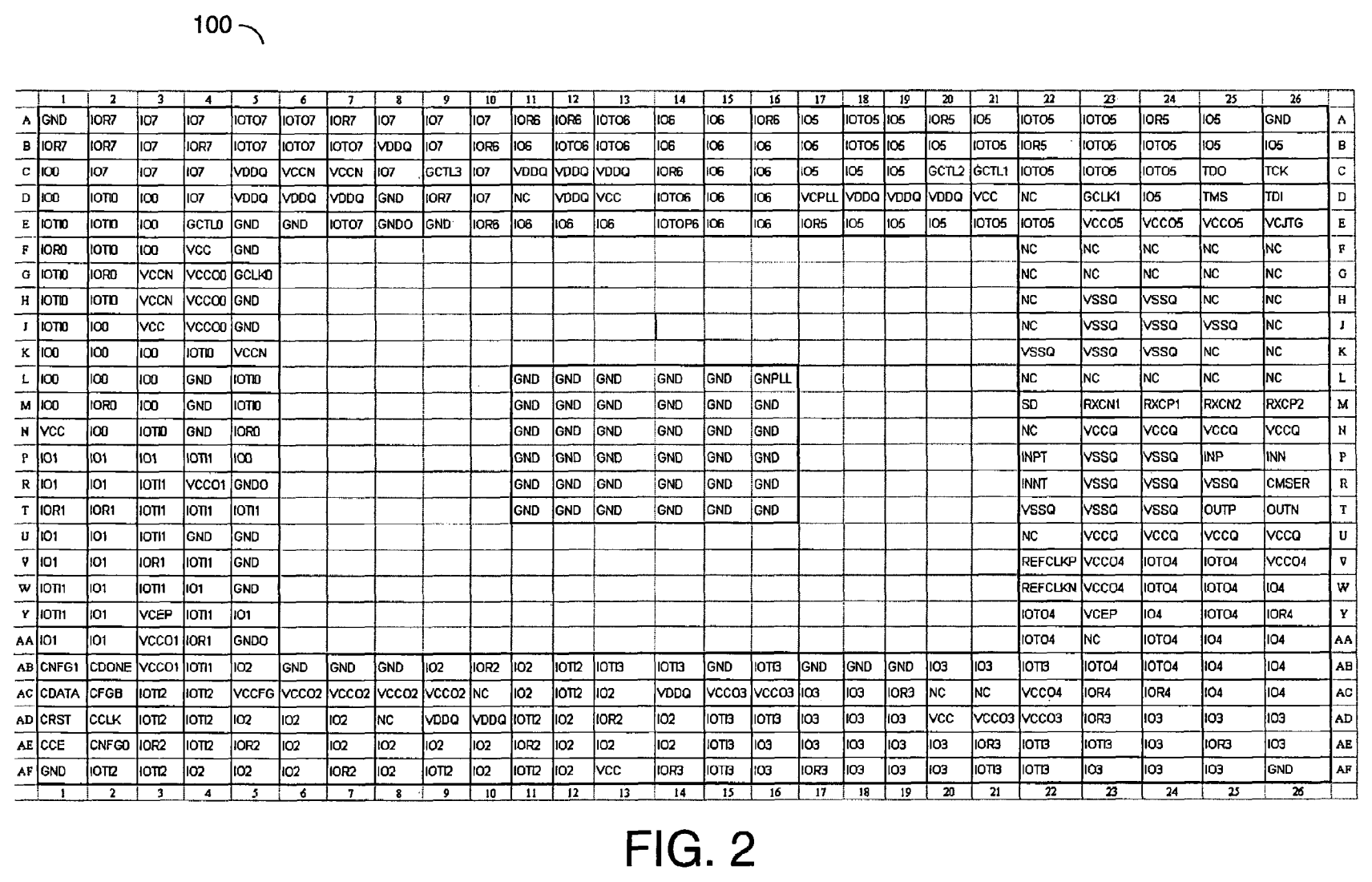

Referring to FIG. 2, a block diagram of system (or circuit) 100 is shown illustrating an implementation of the process 50 (or 50'). The circuit 100 may be a BGA layout. In one example, the circuit 100 may be a PSI family member with 100 K programmable logic gate density and one set of transceiver channels at 2.5 Gbps. The circuit 100 may also have predetermined features (e.g., I/O technologies, such as InfiniBand compliant, or any other appropriate technologies). A version of the InfiniBand Specification (i.e., version 1.0.a) was published June 2001 and is hereby incorporated by reference in its entirety. In another example, the circuit 100 may have the same footprint and layout, for another member that may have the same capacity, however, the transceivers may be SONET compliant.

Figure 3:
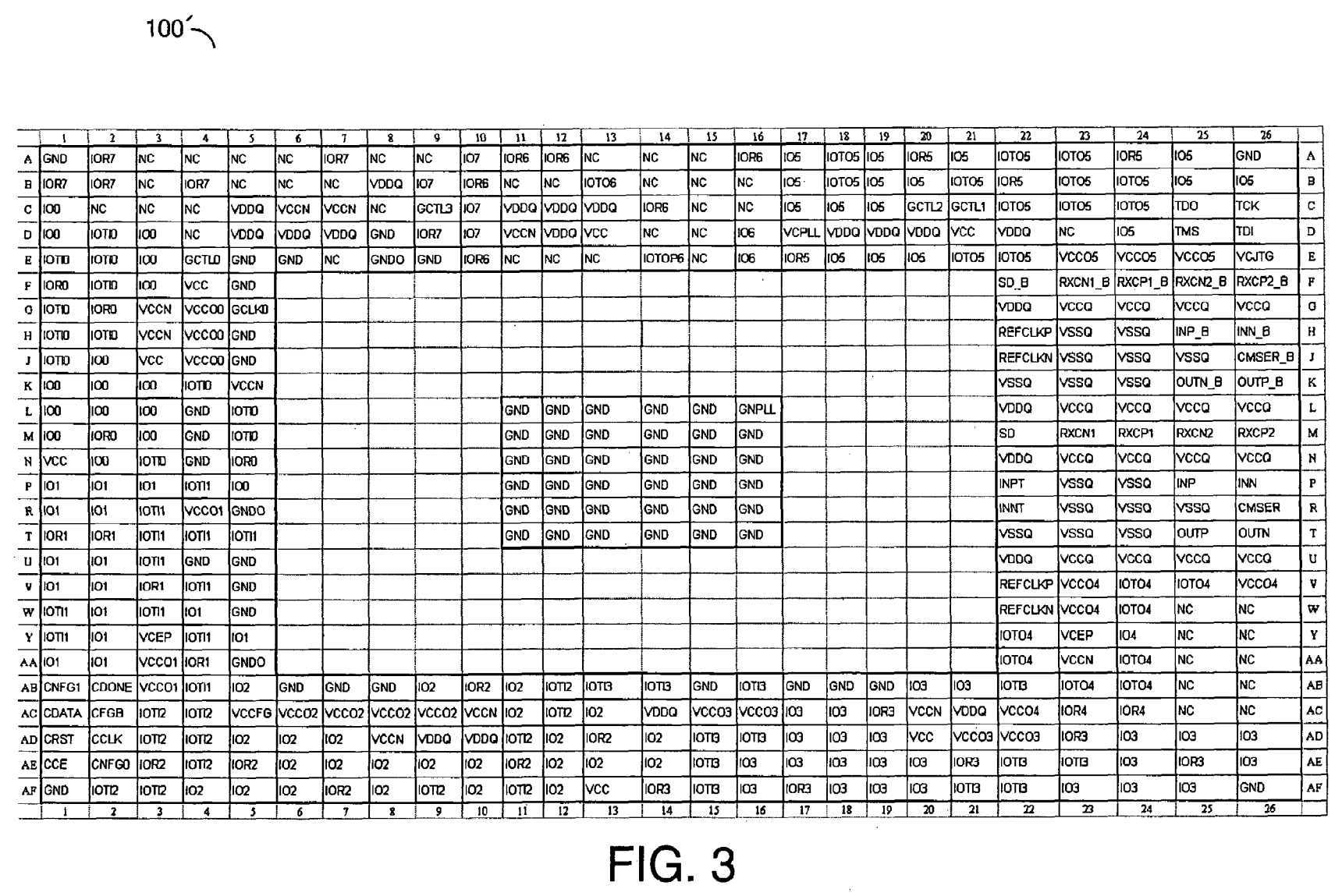

Referring to FIG. 3, a circuit 100' is shown illustrating an implementation of the process 50 (or 50'). The circuit 100' may be a BGA layout. In one example, the circuit 100' may be another PSI family member with 100 K programmable logic gate density and two sets of transceiver channels at 2.5 Gbps. The circuit 100' may be InfiniBand compliant (e.g., a serial transceiver function). In another example, the circuit 100' may have the same footprint and layout, for another member with different locations of no-connect pins and the transceiver being SONET compliant.

The process 50 (or 50') may generate a superset pinout for a family of programmable serial interface (PSI) devices. The process 50 (or 50') may allow for different gate densities and different numbers and functions of transceiver channels to be accommodated by a superset pinout. The process 50 (or 50') may provide a user with a PSI device design migration path to higher CPLD gate densities and more SERDES transceiver bandwidth within a common footprint. The process 50 (or 50') may eliminate footprint changes when users replace a device with another having a different programmable logic gate density while in the same family, since a common footprint exists for the two members. The process 50 may eliminate footprint changes when users replace a device with another having a different number of high-speed serial channels while in the same family, since a common footprint exists for the two members.

The process 50 (or 50') may eliminate footprint changes and reduce or eliminate layout changes when users replace a device with another having different functions for the high-speed serial channels. The process 50 (or 50') may reduce or eliminate routing changes when users replace a device with another having a different programmable logic gate density while in the same family, since a common footprint exists for the two members. Therefore, users may design board layouts to accommodate for more than one member of a family without external components to allow for later changes, without affecting layout. The process 50 (or 50') may reduce or eliminate layout changes when users replace a device with another having a different number of high-speed serial channels while in the same family.

The process 50 (or 50') may provide additional cost savings for manufacturers. For example, one device member having one serial channel may call for a single transceiver block. At the same time, another member in the same family may have the same footprint and two transceivers channels (e.g., implement two transceivers blocks). The method 50 (or 50') may allow the devices to have the same layout, while the device having fewer channels may not incur the additional cost of a second transceiver block.

The function performed by the flow charts of FIGS. 1a and 1b may be implemented using a conventional general purpose digital computer programmed according to the teachings of the present specification, as will be apparent to those skilled in the relevant art(s). Appropriate software coding can readily be prepared by skilled programmers based on the teachings of the present disclosure, as will also be apparent to those skilled in the relevant art(s).

The present invention may also be implemented by the preparation of ASICs, FPGAs, or by interconnecting an appropriate network of conventional component circuits, as is described herein, modifications of which will be readily apparent to those skilled in the art(s).

The present invention thus may also include a computer product which may be a storage medium including instructions which can be used to program a computer to perform a process in accordance with the present invention. The storage medium can include, but is not limited to, any type of disk including floppy disk, optical disk, CD-ROM, and magneto-optical disks, ROMS, RAMs, EPROMs, EEPROMS, Flash memory, magnetic or optical cards, or any type of media suitable for storing electronic instructions.

While the invention has been particularly shown and described with reference to the preferred embodiments thereof, it will be understood by those skilled in the art that various changes in form and details may be made without departing from the spirit and scope of the invention.

The invention claimed is:

1. A method for generating a superset pinout for a family of devices, comprising the steps of:

(A) defining a pinlist for each device within said family of devices, wherein said family of devices comprises devices having either (i) different numbers of high-speed transceiver channels, (ii) different functions of high-speed transceiver channels or (iii) different numbers and functions of high-speed transceiver channels;

(B) generating a superset listing of pins from said pinlist for each device within said family of devices;

(C) creating said superset pinout for said family of devices from said superset listing of pins to eliminate potential footprint variations within said family of devices; and (D) marking each pin of said superset pinout associated with each member of said family of devices.

2. The method according to claim 1, wherein step (D) further comprises:
customizing a superset grid representing said superset pinout according to said superset listing of pins.

3. The method according to claim 2, wherein said customizing comprises:
marking a specific pin in said superset grid for each member of said family of devices.

4. The method according to claim 1, wherein said family of devices comprises devices with combined programmable logic and high-speed serial channels.

5. The method according to claim 1, wherein step (C) further comprises:
using said superset pinout to eliminate potential layout variations within said family of devices.

6. The method according to claim 1, wherein step (B) further comprises:
combining pins shared by more than one member of said family of devices.

7. The method according to claim 1, wherein step (C) further comprises:
allocating a pin for each signal in said pinlist.

8. The method according to claim 1, wherein step (C) further comprises:
providing a common footprint for each member of said family of devices.

9. The method according to claim 1, wherein step (C) further comprises:
designing a board layout (i) to accommodate more than one member of said family of devices and (ii) to allow for a change from one member of said family of devices to another member of said family of devices without affecting said board layout and without external components.

10. The method according to claim 1, wherein step (C) further comprises:
limiting each pin of said superset pinout to a single function.

11. The method according to claim 1, wherein step (D) further comprises:
marking one or more pins of said superset pinout no-connect for a particular member device.

12. The method according to claim 1, wherein said family of devices further comprise programmable logic devices and high-speed serial channel devices.

13. The method according to claim 12, wherein said family of devices further comprises devices with one or more sets of 2.5 Gbps transceiver channels.

14. The method according to claim 12, wherein said family of devices further comprises one or more devices having higher gate densities than other members of said family of devices.

15. The method according to claim 12, wherein said family of devices further comprises one or more devices having increased bandwidth channels.

16. The method according to claim 1, wherein the devices having different functions of high-speed transceiver channels comprise devices having Infiniband compliant functions and SONET compliant functions.

17. An apparatus for generating a superset pinout for a family of devices comprising:
means for defining a pinlist for each device within said family of devices, wherein said family of devices comprises devices having either (i) different numbers of high-speed transceiver channels, (ii) different functions of high-speed transceiver channels or (iii) different numbers and functions of high-speed transceiver channels;
means for generating a superset listing of pins from said pinlist for each device within said family of devices;
means for creating said superset pinout for said family of devices from said superset listing of pins, wherein said superset pinout eliminates layout changes when migrating between devices within said family of devices; and
means for marking each pin of said superset pinout associated with each member of said family of devices.

18. A computer readable medium having instructions for causing a computer to execute a method for generating a superset pinout for a family of devices, wherein said method comprises the steps of:
defining a pinlist for each device within said family of devices;
generating a superset listing of pins from said pinlist for each device within said family of devices;
creating said superset pinout for said family of devices from said superset listing of pins; and
marking each pin of said superset pinout associated with each member of said family of devices, wherein said family of devices comprises two or more devices having either (i) different numbers of high-speed transceiver channels, (ii) different functions of high-speed transceiver channels or (iii) different numbers and functions of high-speed transceiver channels and said superset pinout is configured to reduce layout and footprint changes on a board configured to connect to each member of said family of devices.

* * * * *